(12) United States Patent
Hotellier

(10) Patent No.: US 9,847,365 B2
(45) Date of Patent: Dec. 19, 2017

(54) ELECTRONIC COMPONENT AND METHOD OF MANUFACTURING THE SAME

(71) Applicant: STMicroelectronics (Crolles 2) SAS, Crolles (FR)

(72) Inventor: Nicolas Hotellier, Jarrie (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/960,018

(22) Filed: Dec. 4, 2015

(65) Prior Publication Data

US 2016/0372510 A1 Dec. 22, 2016

(30) Foreign Application Priority Data

Jun. 19, 2015 (FR) ..................................... 15 55654

(51) Int. Cl.
  *H01L 27/146* (2006.01)
  *H01L 31/18* (2006.01)
  *H01L 21/768* (2006.01)

(52) U.S. Cl.
  CPC .. *H01L 27/14636* (2013.01); *H01L 21/76898* (2013.01); *H01L 27/1464* (2013.01); *H01L 27/14687* (2013.01); *H01L 27/14689* (2013.01); *H01L 31/1892* (2013.01); *H01L 27/14643* (2013.01)

(58) Field of Classification Search
  CPC .......... H01L 31/1892; H01L 27/76898; H01L 27/1464; H01L 27/14643; H01L 27/14636; H01L 31/18
  See application file for complete search history.

(56) References Cited

U.S. PATENT DOCUMENTS

| | | | |
|---|---|---|---|
| 9,570,494 B1* | 2/2017 | Jerome | H01L 27/1463 |
| 2005/0104148 A1* | 5/2005 | Yamamoto | H01L 27/14601 257/432 |
| 2008/0290525 A1 | 11/2008 | Anderson et al. | |
| 2008/0290526 A1* | 11/2008 | Chen | H01L 22/34 257/774 |
| 2009/0309232 A1* | 12/2009 | Roy | H01L 21/76898 257/774 |
| 2010/0181637 A1* | 7/2010 | Harada | H01L 27/14621 257/459 |
| 2011/0237068 A1 | 9/2011 | Fournel et al. | |
| 2015/0325497 A1* | 11/2015 | Yu | H01L 21/31116 257/774 |
| 2017/0011987 A1* | 1/2017 | Lee | H01L 21/288 |

FOREIGN PATENT DOCUMENTS

FR   2930840 A1   11/2009

OTHER PUBLICATIONS

INPI Search Report and Written Opinion for FR 1555654 dated Apr. 11, 2016 (8 pages).

* cited by examiner

*Primary Examiner* — Asok K Sarkar
*Assistant Examiner* — Grant Withers
(74) *Attorney, Agent, or Firm* — Gardere Wynne Sewell LLP

(57) ABSTRACT

An electronic component includes a semiconductor layer having a first surface coated with a first insulating layer and a second surface coated with an interconnection structure. A laterally insulated conductive pin extends through the semiconductor layer from a portion of conductive layer of the interconnection structure all the way to a contact pad arranged at the level of the first insulating layer.

14 Claims, 5 Drawing Sheets

ELECTRONIC COMPONENT AND METHOD OF MANUFACTURING THE SAME

PRIORITY CLAIM

This application claims the priority benefit of French Application for Patent No. 1555654, filed on Jun. 19, 2015, hereby incorporated by reference in its entirety to the maximum extent allowable by law.

TECHNICAL FIELD

The present disclosure relates to an electronic component and to a method of manufacturing the same. The present disclosure more specifically relates to an electronic component comprising a semiconductor layer crossed by insulated connections.

BACKGROUND

FIG. 1 is a perspective cross-section view schematically showing an example of an image sensor.

The image sensor comprises a semiconductor layer 1 having a first surface F1, called front surface, supported by a stack of insulating layers 4 having an interconnection structure 5 arranged therein, and having a second surface F2, called rear (or back) surface, intended to receive an illumination and coated with an insulating layer 7. Insulating layer 7, semiconductor layer 1, and the stack of insulating layers 4 rest on a support 9, the stack of insulating layers 4 extending between semiconductor layer 1 and support 9. Interconnection structure 5, only a portion thereof being shown, is formed of portions of conductive layers 11 and of vias 13, some of which interconnect portions of conductive layers 11.

In a central portion of the sensor, the semiconductor layer comprises an array of pixels 15. Each pixel 15 comprises various electronic components (not shown), particularly a photosensitive component such as a photodiode, and one or a plurality of transistors formed on the side of front surface F1 of the semiconductor layer. At the level of front surface F1, the electronic components of the pixels are in contact with vias 13 of interconnection structure 5. On the side of rear surface F2 of the semiconductor layer, each pixel 15 is topped with a color filter 17 resting on upper surface F2' of insulating layer 7, or rear surface of the sensor.

The sensor comprises insulated connections 19 formed at the periphery of pixel array 15. Each insulated connection 19 is formed from an opening 21 extending from rear surface F2' of the sensor all the way to front surface F1 of semiconductor layer 1. A metal layer 23 coats the bottom and the lateral walls of opening 21 and partly extends over rear surface F2' of the sensor to form a pad 24 therein. All across the thickness of the semiconductor layer, metal layer 23 is separated from the semiconductor layer by an insulating cladding 25. At the bottom of the opening, metal layer 23 is in contact with a portion of conductive layer 11 via one or a plurality of vias 13 of interconnection structure 5. Thus, pad 24 is electrically coupled with one or a plurality of electronic components formed in semiconductor layer 1.

FIG. 1 is not drawn to scale and, in practice, in top view, openings 21 have lateral dimensions, currently a side length or diameter from 20 to 100 μm, much larger than the lateral dimensions of pixels 15, which generally having a side length from 1 to 5 μm.

To manufacture the sensor of FIG. 1, the various electronic components of the sensor are formed from front surface F1 of semiconductor layer 1, after which interconnection structure 5 and the stack of insulating layer 4 are formed on surface F1. The assembly of semiconductor layer 1 and of the stack of insulating layers 4 is then mounted on support, or handle, 9 as shown in FIG. 1. Then only, openings 21 are formed by reactive ion etching from rear surface F2' of the sensor all the way to front surface F1 and a metal layer 23 is deposited and etched to form insulated connections 19 and pads 24. Finally, color filters 17 are formed on rear surface F2' of the sensor by successive steps of deposition and etching of one or a plurality of layers.

A sensor of the type in FIG. 1 and its manufacturing method have various disadvantages, at least some of which are desired to be overcome.

SUMMARY

Thus, an embodiment provides an electronic component comprising a semiconductor layer having a first surface coated with a first insulating layer and having a second surface coated with an interconnection structure, wherein a laterally insulated conductive pin extends through the semiconductor layer from a portion of conductive layer of the interconnection structure all the way to a contact pad arranged at the level of the first insulating layer.

According to an embodiment, the lateral dimensions of the conductive pin are greater than 20 μm.

According to an embodiment, the thickness of the semiconductor layer is in the range from 0.1 to 20 μm.

According to an embodiment, the thickness of the semiconductor layer is in the range from 3 to 5 μm.

According to an embodiment, photodiodes are formed in the semiconductor layer and are intended to receive an illumination on the side of the first surface (i.e., they are back-side illuminated (BSI) as understood in the art).

According to another aspect, an embodiment provides a method of manufacturing an electronic component comprising the successive steps of: a) providing a semiconductor layer having a first surface resting on a first insulating layer resting on a substrate, and having a second surface coated with a second insulating layer; b) etching an opening through the second insulating layer and the semiconductor layer all the way to the first insulating layer; c) forming an insulated conductive pin laterally filling the opening; d) forming, on the second insulating layer, an interconnection structure comprising a portion of conductive layer in contact with the conductive pin; e) removing the substrate; f) etching a cavity through the first insulating layer all the way to the conductive pin; and g) forming a contact pin in the cavity.

According to an embodiment, the conductive layer portion belongs to the metallization level of the interconnection structure closest to the second surface.

According to an embodiment, at step a), an insulating portion is provided in the semiconductor layer and extends from the first surface to the second surface; and step b) comprises removing by etching a central portion of the insulating portion while leaving in place an insulating cladding on the lateral walls of the opening.

According to an embodiment, at step c), the opening is filled with a conductive material, after which a chem.-mech. polishing step is carried out all the way to the second insulating layer.

According to an embodiment, at step c), a diffusion barrier layer is deposited on the walls and the bottom of the opening before filling the opening with the conductive material.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
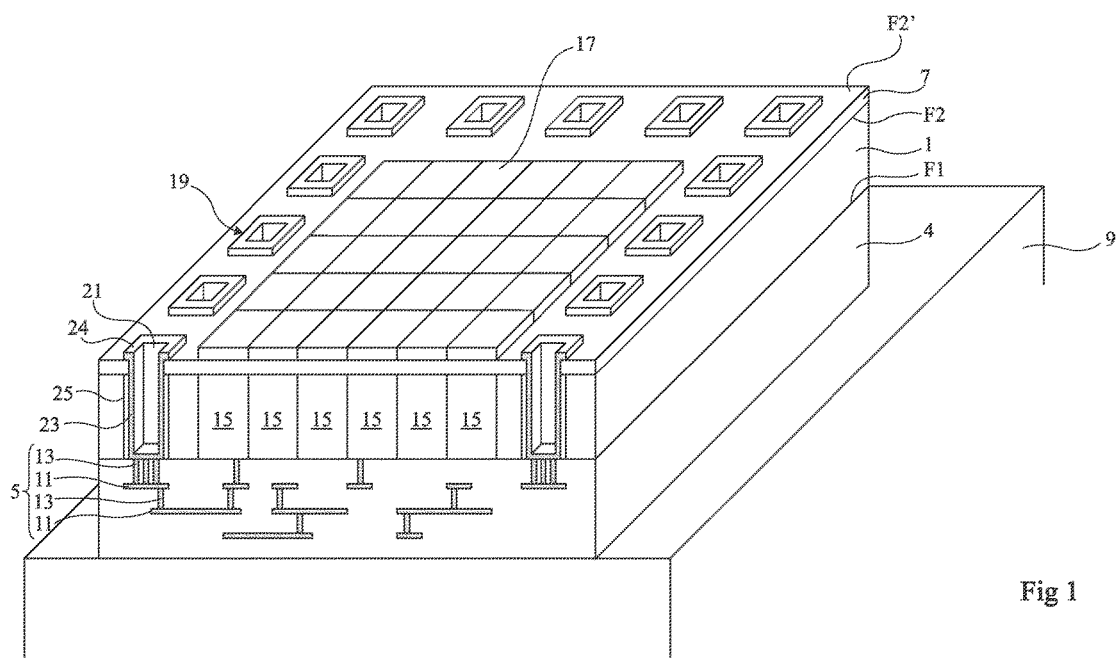
FIG. 1, previously described, is a perspective cross-section view of an image sensor.

The same elements have been designated with the same reference numerals in the different drawings and, further, the various drawings are not to scale. For clarity, only those elements which are useful to the understanding of the described embodiments have been shown and are detailed. In the following description, unless otherwise indicated, terms "bottom", "top", "lateral", "upper", "lower", and "under" refer to the orientation of the concerned elements in the corresponding drawings.

Figure 2A:
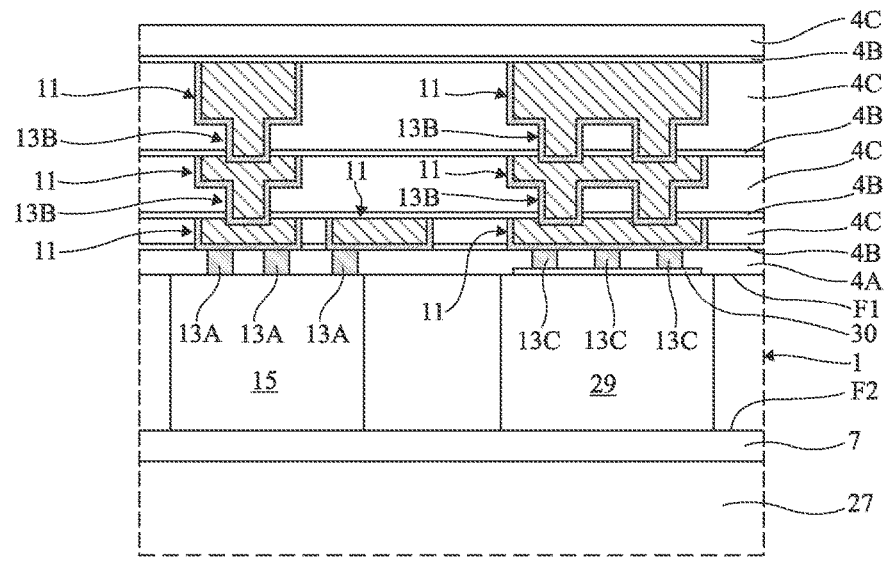
FIGS. 2A and 2B illustrate a method of manufacturing an image sensor of the type in FIG. 1.

FIG. 2A is a simplified cross-section view showing a structure at an intermediate step of a method of manufacturing an image sensor of the type in FIG. 1.

The structure comprises a semiconductor layer 1 having the sensor pixels formed therein, a single pixel 15 being shown in this drawing. Rear surface F2 of semiconductor layer 1 is laid on insulating layer 7, itself laid on a substrate 27, for example, a semiconductor substrate, semiconductor layer 1 and insulating layer 7 forming an SOI-type stack ("Silicon On Insulator"). Front surface F1 of semiconductor layer 1 is coated with a stack of insulating layers comprising, from front surface F1, an insulating layer 4A and an alternation of insulating layers 4B and 4C. An interconnection structure, only a portion of which is shown, is embedded in the stack of insulating layers 4A, 4B, and 4C. The interconnection structure is formed of portions of conductive layers 11, and of vias, in the present example vias, or contacts, 13A and 13C, and vias 13B. Contacts 13A cross insulating layer 4A and enable to create an electric connection between electronic components (not shown) formed in semiconductor layer 1, and portions of conductive layers 11 of the lower metallization level of the interconnection structure, that is, of the metallization level comprising the conductive layer portions 11 closest to semiconductor layer 1. Vias 13B interconnect conductive layer portions 11 through insulating layers 4B and 4C. One or a plurality of contacts 13C cross insulating layer 4A and enable to create an electric connection between a conductive layer portion 11 of the lower metallization level and a doped polysilicon layer 30 resting on front surface F1. Under layer 30, at a location where an insulated connection is desired to be formed, a portion of semiconductor layer 1 has been replaced, across its entire thickness, with an insulating portion 29.

Figure 2B:
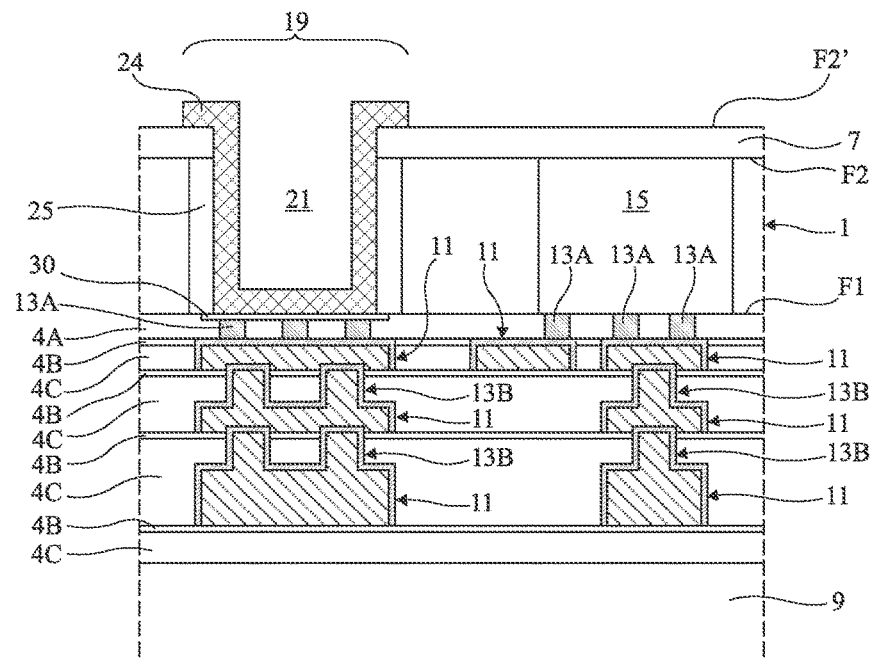

FIG. 2B is a cross-section view showing the structure of FIG. 2A after the placing of a support, or handle, 9 on the stack of insulating layers 4A, 4B, and 4C, the flipping of the assembly thus obtained, and the removal of substrate 27 all the way to insulating layer 7. An opening 21 has been etched through the semiconductor layer, from exposed surface F2' of the structure all the way to doped polysilicon layer 30. The opening is formed by removing by reactive ion etching a central portion of insulating portion 29 to leave in place a portion of insulating portion 29 on the lateral walls of opening 21 to form an insulating cladding 25 therein. To form an insulated connection 19 in opening 21, a metal layer 23 has been deposited over the entire structure, on the side of surface F2'. Metal layer 23 has then been etched to leave in place a portion coating the lateral walls and the bottom of opening 21. Metal layer portion 23 continues over surface F2', around 21, to form a contact pad 24 therein.

After a step, not shown, of forming color filters 17 on surface F2', a sensor of the type of that in FIG. 1 can be obtained.

A disadvantage of the previously-described manufacturing method is that openings 21 etched in insulating layer 7 and in semiconductor layer 1, from rear surface F2', are only partially filled with metal layer 23. The thickness of the semiconductor layer is in the range from 0.1 to 20 µm, for example, from 3 to 5 µm, whereby, in addition to having large lateral dimensions, openings 21 may be deep. The presence of such wide and deep openings on the side of rear surface FT makes subsequent deposition or treatment steps performed on this surface, especially to form color filters 17, more complex.

An insulated connection structure and a method of manufacturing an electronic component comprising such insulated connections which enables to overcome at least the above-mentioned disadvantage is here provided.

Figure 3A:
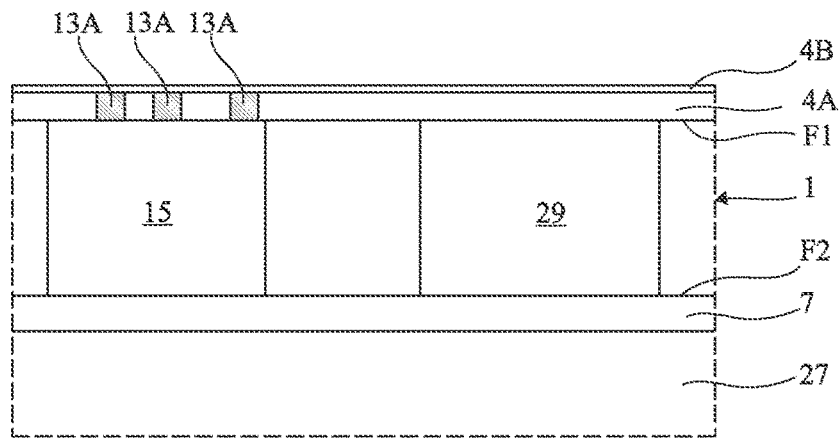
FIGS. 3A to 3F illustrate an embodiment of an image sensor manufacturing method.

FIGS. 3A to 3F are cross-section views schematically showing a structure at successive steps of an embodiment of an image sensor manufacturing method, FIG. 3A showing this structure at an intermediate step of the method.

In FIG. 3A, the structure comprises a semiconductor layer 1 having the sensor pixels formed therein, a single pixel 15 being shown in FIG. 3A. Front surface F1 of the semiconductor layer is coated with an insulating layer 4A which may be coated with an insulating layer 4B. At the level of surface F1, the electronic components of the pixels are in contact with vias, or contacts, 13A. Contacts 13A have been formed through insulating layer 4A all the way to front surface F1. Rear surface F2 of the semiconductor layer rests on an insulating layer 7, itself resting on a substrate 27. At a location where an insulated connection is desired to be formed, a portion of semiconductor layer 1 has been replaced, across its entire thickness, with an insulating portion 29.

As an example, insulating portion 29 is made of silicon oxide formed in an opening formed, prior to the forming of insulating layers 4A and 4B, from front surface F1 of the semiconductor layer all the way to insulating layer 7. Contacts 13A are for example made of tungsten. Insulating layers 4A and 4B are for example respectively made of silicon oxide and of silicon nitride. Insulating layer 7 is for example made of silicon oxide having a thickness which may range from 0.1 to 3 µm. Substrate 27 is for example a silicon substrate. Semiconductor layer 1 is for example a silicon layer having a thickness which may range from 1 to 20 µm.

Figure 3B:
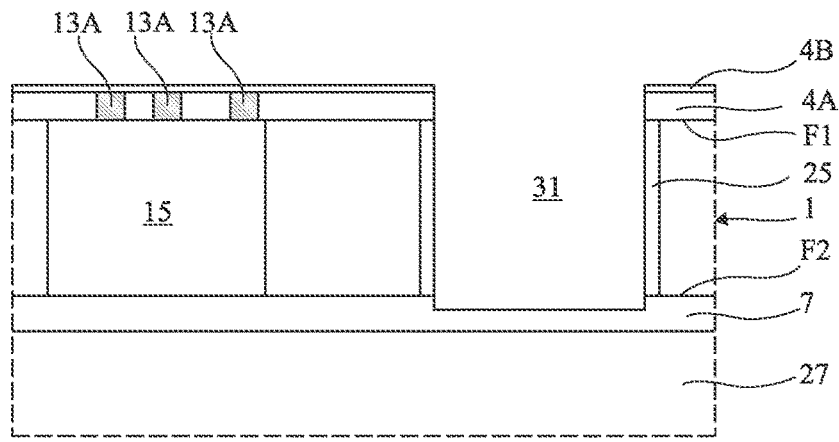

FIG. 3B shows the structure of FIG. 3A after the forming of an opening 31 extending from the upper surface of the structure all the way to insulating layer 7, through semiconductor layer 1. The opening is formed by removing by etching, for example, by reactive ion etching, a central portion of insulating portion 29 to leave in place a portion of insulating portion 29 on the lateral walls of opening 31 to form an insulating cladding 25 therein. The etching may be stopped on insulating layer 7 or, as shown, may slightly penetrate into layer 7. As an example, in top view, opening 31 has a diameter or a side length from 20 to 100 µm, for example, 60 µm.

Figure 3C:
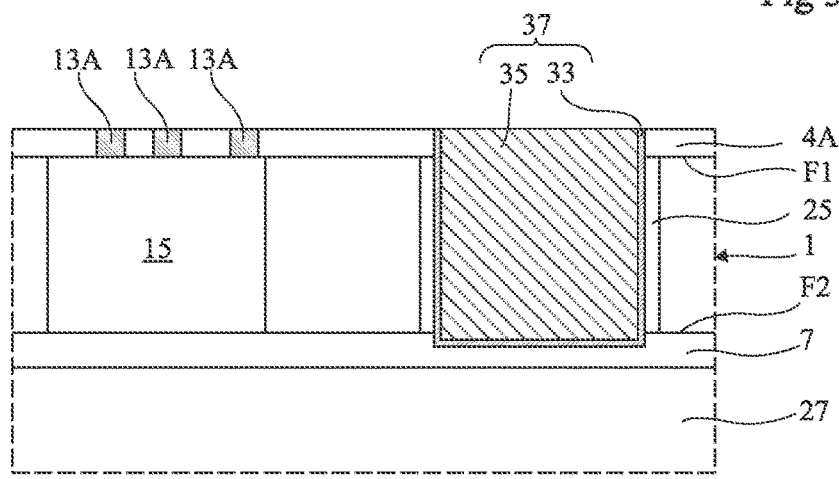

FIG. 3C shows the structure of FIG. 3B after the deposition of a diffusion barrier 33 and of a conductive material 35 filling opening 31. A chemical-mechanical polishing (CMP) has then been carried out all the way to layer 4A to form a conductive pin 37 laterally insulated from semiconductor layer 1 by insulating cladding 25. As an example, diffusion barrier layer 33 is made of titanium, tantalum, titanium nitride, or tantalum nitride. Conductive material 35 is for example made of copper.

Figure 3D:
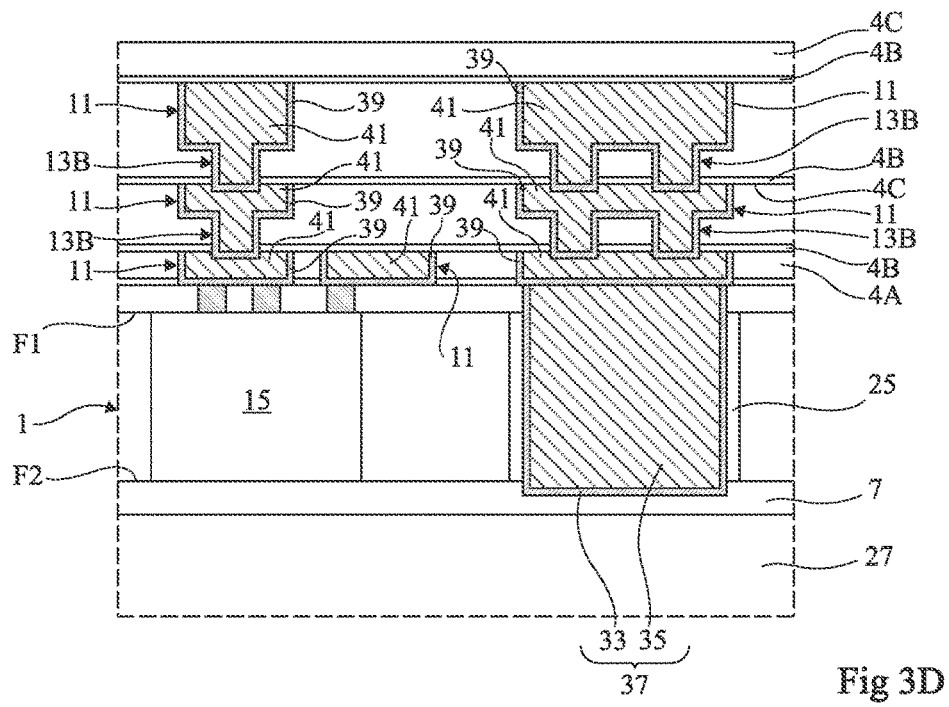

FIG. 3D shows the structure of FIG. 3C after the forming of an interconnection structure (partially shown) on the upper surface of insulating layer 4A. The interconnection structure is formed by successive steps of depositing and etching insulating layers, 4B and 4C in the present example, and conductive layers, 39 and 41 in the present example, to form portions of conductive layers 11 separated by layers 4B and 4C crossed by vias 13B. The successive deposition and etching steps are carried out so that the top of conductive pin 37, preferably the entire surface of the top, is in contact with a portion of conductive layers 11 of the lower metallization level of the interconnection structure.

As an example, the material of conductive layers 41 is the same, in this example copper, as conductive material 35 of conductive pin 37. Conductive layers 39 are diffusion barrier layers, for example, made of the same material as diffusion barrier layer 33. Insulating layers 4B and 4C are for example silicon nitride and silicon oxide layers.

Figure 3E:
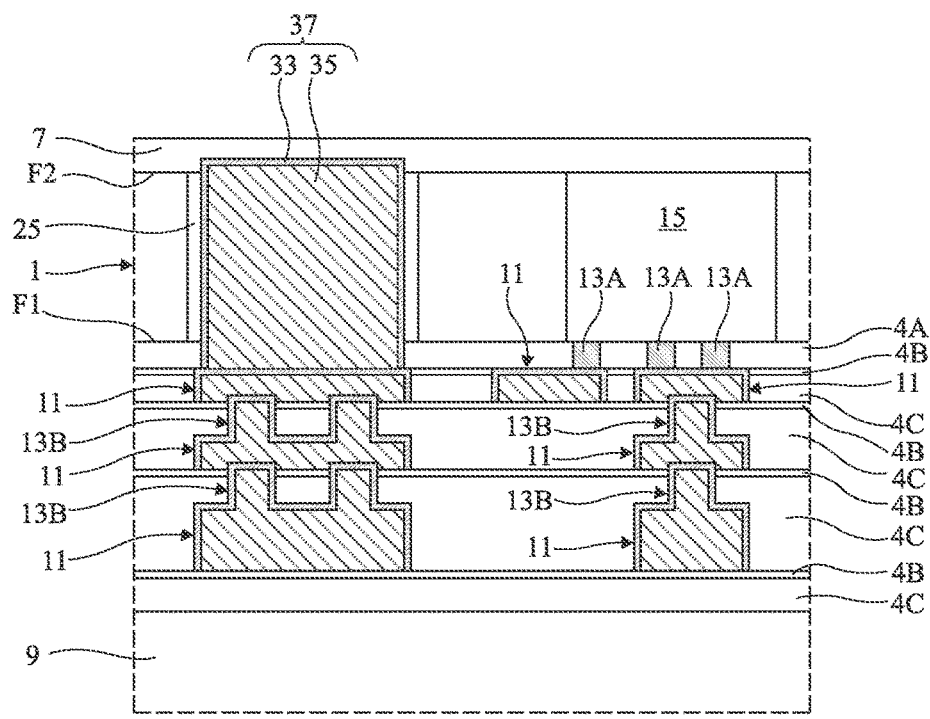

FIG. 3E shows the structure of FIG. 3D after the placing of a support, or handle, 9 on the interconnection structure, the flipping of the assembly thus obtained, and the removal of substrate 27, for example, by chemical-mechanical polishing (CMP) all the way to insulating layer 7. Support 9 is for example a silicon or glass substrate assembled by molecular bonding on upper insulating layer 4C of FIG. 3D.

Figure 3F:
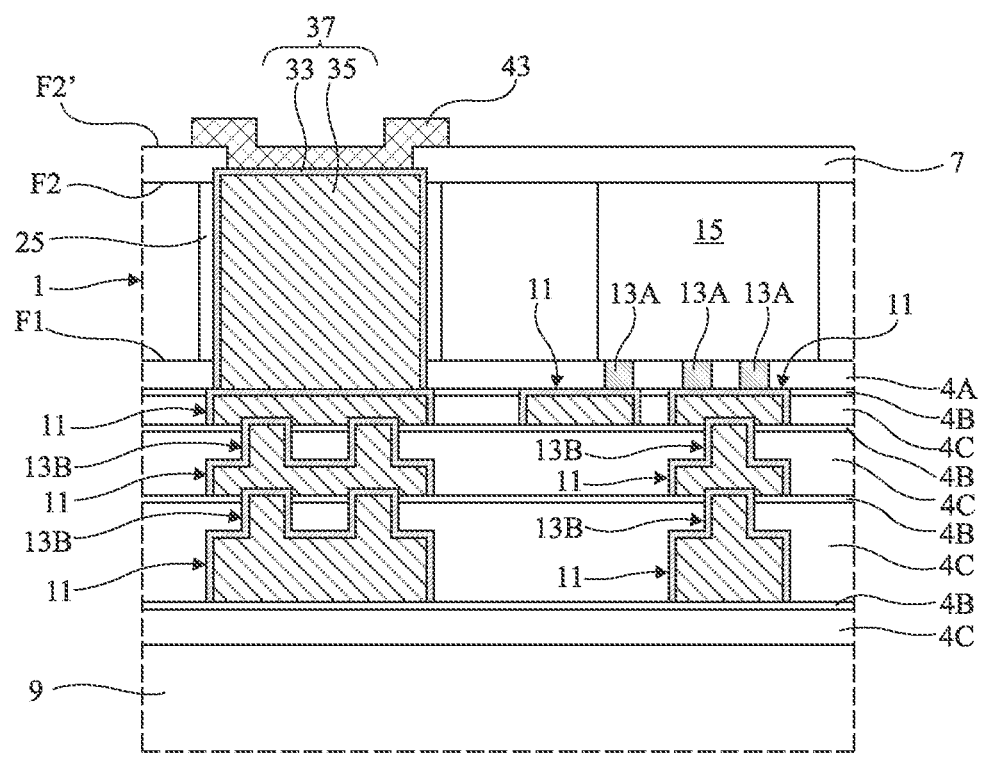

FIG. 3F shows the structure of FIG. 3E after etching of a cavity in insulating layer 7 all the way to conductive pin 37, and forming in this cavity a contact pad 43, for example, by depositing and etching a layer of a conductive material such as aluminum or copper.

It should here be noted that the cavity filled with contact pad 43 is formed through the insulating layer 7 only and not through insulating layer 7 and semiconductor layer 1 as described in relation with FIGS. 1 and 2B. Thus, rear surface F2' of the electronic component of FIG. 3F has smaller thickness inequalities than the electronic component of FIG. 1 or 2B. As an example, the level difference between rear surface F2' and the exposed surface of contact pad 43 of the electronic component of FIG. 3F is smaller than 3 µm, preferably smaller than 1 µm. As a result, the subsequent deposition or treatment steps carried out on surface FT of the component of FIG. 3F are simpler to implement that when they are formed on rear surface F2' of the electronic component of FIG. 1 or 2B. In particular, the deposition of color filters on surface F2' of the component of FIG. 3F is simpler to perform than on surface F2' of the component of FIG. 1 or 2B.

It should be noted that the method described in relation with FIGS. 3A to 3F only comprises one additional step with respect to the manufacturing method described in relation with FIGS. 2A and 2B, that is, the forming of conductive pin 37 in semiconductor layer 1.

Specific embodiments have been described. Various alterations, modifications, and improvements will readily occur to those skilled in the art. In particular, the method of manufacturing an insulated connection such as described in relation with FIGS. 3A to 3F in the case of an image sensor applies to any type of electronic component where an insulated connection from an interconnection structure arranged on the side of a first surface of a semiconductor layer up to a contact pad arranged on the side of a second surface of this semiconductor layer is desired to be formed. Further, it should be understood that such insulated connections may be formed at various locations of a semiconductor chip, for example, in a central area of the semiconductor chip rather than at the periphery thereof.

A manufacturing method where a conductive pin 37 is laterally insulated by a cladding 25 resulting from the central etching of an insulating portion 29 has been described. In an alternative embodiment, insulating cladding 25 may be formed by deposition of an insulating layer on the lateral walls of opening 31, before forming conductive pin 37. It would then not be useful to provide insulating portion 29 in semiconductor layer 1.

It will be within the abilities of those skilled in the art to adapt the order and the number of steps of the manufacturing method described in relation with FIGS. 3A to 3F. For example, this method may comprise additional steps of deposition of microlenses on the side of rear surface F2'. The interconnection structure may also be formed in other insulating layers than layers 4B and 4C and from other conductive layers than layers 39 and 41 as soon as a portion of conductive layers 11 of the lower metallization level of this interconnection structure is in contact with the top of conductive pin 37.

Further, the materials previously indicated as an example may be adapted by those skilled in the art, particularly each of layers 33, 39, 4A, 4B, 4C, and 7 may be formed of a stack of layers of different materials rather than by a layer of a given material.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of manufacturing an electronic component comprising the successive steps of:
   a) providing a semiconductor layer having a first surface resting on a first insulating layer resting on a substrate and having a second surface coated with a second insulating layer, and providing an insulating portion in the semiconductor layer extending from the first surface to the second surface;
   b) etching an opening through the second insulating layer and a central portion of the insulating portion in the semiconductor layer to the first insulating layer and leaving in place an insulating cladding on lateral walls of the opening;
   c) forming a laterally-insulated conductive pin filling the opening, the conductive pin being laterally insulated by the insulating cladding;
   d) forming, on the second insulating layer, an interconnection structure comprising a conductive layer portion in contact with the conductive pin;
   e) removing the substrate;
   f) etching a cavity through the first insulating layer to the conductive pin; and
   g) forming a contact pad in the cavity.

2. The manufacturing method of claim 1, wherein the conductive layer portion belongs to the metallization level of the interconnection structure closest to the second surface.

3. The manufacturing method of claim 1, wherein, at step c) further comprising filling the opening with a conductive material, and chemical-mechanical polishing to the second insulating layer.

4. The manufacturing method of claim 3, wherein at step c) further comprising depositing a diffusion barrier layer on the lateral walls and bottom of the opening before filling the opening with the conductive material.

5. A manufacturing method, comprising:
forming a photosensitive region in a semiconductor substrate layer having a front surface and a back surface;
forming a region of insulating material extending from the front surface to the back surface;
etching an opening in the region of insulating material extending from the front surface to the back surface, said opening leaving a portion of the insulating material in place at a peripheral sidewall of said opening to insulate the opening from the semiconductor substrate layer;
completely filling the opening with a metal material to form an electrical block; and
forming electrically interconnecting layers over the front surface, said electrically interconnecting layers including a first electrical connection structure electrically connected to the electrical block and a second electrical connection structure electrically connected to the photosensitive region.

6. The method of claim 5, further comprising forming an insulating layer on the back surface.

7. The method of claim 6, further comprising:
forming an aperture through the insulating layer to reach the electrical block; and
filling the aperture with an electrically conducting material to form a connection pad.

8. The method of claim 5, further comprising:
forming a further insulating layer on the front surface;
forming an electrical contact extending through the further insulating layer to make electrical connection to the photosensitive region in the semiconductor substrate layer, said electrical contact made of a metal material different from the metal material forming the electrical block.

9. The method of claim 8, wherein forming the electrically interconnecting layers over the front surface comprises:
forming the first electrical connection structure over the further insulating layer, said first electrical connection structure comprising: a first metal layer having a bottom surface in direct contact with a top surface of the electrical block and a first metal via extending from a top surface of the first metal layer; and
forming the second electrical connection structure over the further insulating layer, said second electrical connection structure comprising: a second metal layer having a bottom surface in direct contact with a top surface of the electrical block and a second metal via extending from a top surface of the second metal layer.

10. The method of claim 9, wherein the first and second metal layers are coplanar.

11. A manufacturing method, comprising:
forming a photosensitive region in a semiconductor substrate layer having a front surface and a back surface;
forming a region of insulating material extending from the front surface to the back surface;
depositing a first insulating layer on the front surface;
depositing a second insulating layer on the back surface;
forming an electrical contact extending through the first insulating layer to make electrical connection to the photosensitive region in the semiconductor substrate layer, said electrical contact made of a first conductive material;
etching an opening extending through the first insulating layer and further extending through the region of insulating material to reach at least to said second insulating layer, said opening leaving a portion of the region of insulating material in place at a peripheral sidewall of said opening to insulate the opening from the semiconductor substrate layer;
completely filling the opening with a second conductive material to form an electrical block, wherein the second conductive material is different from the first conductive material;
forming a first interconnect over the first insulating material, said first interconnect comprising: a first metal layer having a bottom surface in direct contact with a top surface of the electrical block and a first metal via extending from a top surface of the first metal layer; and
forming a second interconnect over the first insulating material, said second interconnect comprising: a second metal layer having a bottom surface in direct contact with a top surface of the electrical contact and a second metal via extending from a top surface of the second metal layer.

12. The method of claim 11, wherein the first conductive material is tungsten and the second conductive material is copper.

13. The method of claim 11, further comprising:
forming an aperture through the second insulating layer to reach the electrical block; and
filling the aperture with an electrically conducting material to form a connection pad.

14. The method of claim 11, wherein the first and second metal layers are coplanar.

* * * * *

UNITED STATES PATENT AND TRADEMARK OFFICE
CERTIFICATE OF CORRECTION

PATENT NO. : 9,847,365 B2
APPLICATION NO. : 14/960018
DATED : December 19, 2017
INVENTOR(S) : Nicolas Hotellier It is certified that error appears in the above-identified patent and that said Letters Patent is hereby corrected as shown below:

In the Specification

At Column 4, Line number 19, please replace the term [[FT]] with -- F2' --.

At Column 5, Line number 50, please replace the term [[FT]] with -- F2' --.

Signed and Sealed this
Twenty-ninth Day of May, 2018

Andrei Iancu
*Director of the United States Patent and Trademark Office*